United States Patent
Jacobson et al.

(10) Patent No.: US 7,246,921 B2
(45) Date of Patent: Jul. 24, 2007

(54) BACK-REFLECTING LED LIGHT SOURCE

(75) Inventors: Benjamin A. Jacobson, Chicago, IL (US); Robert D. Gengelbach, Rochester, NY (US)

(73) Assignee: Illumitech, Inc., Chicago, IL (US)

( * ) Notice: Subject to any disclaimer, the term of this patent is extended or adjusted under 35 U.S.C. 154(b) by 61 days.

(21) Appl. No.: 11/050,542

(22) Filed: Feb. 3, 2005

(65) Prior Publication Data

US 2005/0168994 A1  Aug. 4, 2005

Related U.S. Application Data

(60) Provisional application No. 60/541,422, filed on Feb. 3, 2004.

(51) Int. Cl.
*F21V 29/00* (2006.01)
*F21V 7/00* (2006.01)

(52) U.S. Cl. .................................. 362/294; 362/298

(58) Field of Classification Search ............... 362/347, 362/294, 296, 264, 298
See application file for complete search history.

(56) References Cited

U.S. PATENT DOCUMENTS

| | | | |
|---|---|---|---|
| 4,507,719 A * | 3/1985 | Quiogue | 362/404 |
| 5,005,958 A | 4/1991 | Winston et al. | |
| 6,439,888 B1 * | 8/2002 | Boutoussov et al. | 433/215 |
| 6,639,733 B2 | 10/2003 | Minano et al. | |
| 6,646,813 B2 | 11/2003 | Falicoff et al. | |
| 6,652,122 B2 | 11/2003 | Lin | |
| 6,672,741 B1 | 1/2004 | Young | |
| 6,976,769 B2 * | 12/2005 | McCullough et al. | 362/345 |
| 7,011,431 B2 * | 3/2006 | Ono et al. | 362/241 |
| 7,093,952 B2 * | 8/2006 | Ono et al. | 362/194 |
| 2003/0016539 A1 * | 1/2003 | Minano et al. | 362/347 |

* cited by examiner

*Primary Examiner*—Ali Alavi
(74) *Attorney, Agent, or Firm*—Foley & Lardner LLP

(57) ABSTRACT

An LED light source using back-reflecting collection optics with a supporting structure and heat sink to block only a small amount of light. A reflector has a front and back side with an LED positioned on the front side of the reflector. A heat conducting body is positioned at least partially between the reflector and the LED. The heat conducting body provides a pathway for heat to flow from the LED toward the back side of the reflector.

21 Claims, 5 Drawing Sheets

BACK-REFLECTING LED LIGHT SOURCE

CROSS-REFERENCE TO RELATED PATENT APPLICATIONS

This application is an application claiming the benefit under 35 USC 119(e) U.S. Application 60/541,422, filed Feb. 3, 2004, incorporated herein by reference in its entirety.

BACKGROUND OF THE INVENTION

Light-emitting diodes (LEDs) are a commonly used light source in applications including lighting, signaling, signage, and displays. LEDs have several advantages over incandescent and fluorescent lamps, including high reliability, long lifetime, and high efficiency.

A typical prior art LED system is shown in FIG. 1. An LED is placed on a circuit board, which carries electrical current to and from the LED, and allows heat generated by the LED to flow from the relatively small LED to a larger area, from which the heat then escapes to air. Often a heat sink is added to facilitate the heat flow to air. Light is emitted by the LED in a generally upward direction, with a wide (typically ±60–90°) angle. Many applications, such as f narrower, more collimated emission angle. For this purpose secondary collection optics are usually added to redirect the light rays more narrowly upward. (These optics are called "secondary" to distinguish them from the "primary optics" of the LED itself, such as the dome shown in FIG. 1.)

These secondary optics are shown schematically in FIG. 1. The schematic shows the most common configuration, in which light enters one side of the collection optics at a wide angle, and exits a second side at a narrower angle. Typical secondary optics include lenses and reflectors. The optics can be lenses, Fresnel lenses, parabolic reflectors, conical reflectors, compound parabolic concentrators, light pipes, or many other shapes. FIG. 2 shows example arrays of each, taken from "Application Note 1149-5, Secondary Optics Design Considerations for Super Flux LEDs," by Lumileds, Inc. Note that, regardless of the specific design, the optics are most commonly positioned in between the LED and the desired direction of narrow-beam light emission, with the circuit board and heat sink on the opposite side of the LED.

An alternative approach is to use a mirror to reflect light back in the direction of the light source, as shown in FIG. 3. A large variety of reflector shapes are known using this approach, including paraboloidal, ellipsoidal, spherical, compound conic, and faceted. It is well-known in the art of optical design that this approach has significant advantages. Very wide angles can be collected and collimated, and the overall system can be quite compact. For example, for a light source emitting into ±90°, like an LED, a paraboloidal reflector will have a height-to-diameter less than or equal to 0.5. For the approach shown in FIG. 2, however, the height-to-diameter ratio is typically larger, often 1.0 or more. On the other hand, one disadvantage of the approach shown in FIG. 3 is that the light source blocks a portion of the outgoing light. For very narrow angles (<±10°), and if the physical structure supporting the light source is not much larger than the light source itself, then the reflector is typically much larger than the blocking area and the blocked fraction is minimal (<3–5%).

The back-reflector approach of FIG. 3 has been relatively little used with LEDs, however. One major problem is that the circuit board and heat sink are typically much larger than the light source itself. If the heat sink is positioned in the beam path close to the LED, then an unacceptably high fraction of light would be blocked. If the heat sink and circuit board are remotely positioned on the periphery of the beam, then the thermal path to the heat sink is undesirably long and the thermal resistance (temperature increase divided by power applied to the LED, units of ° C./W) is undesirably high.

SUMMARY OF THE INVENTION

The current invention uses the advantages of back-reflecting collection optics for LEDs by using a novel supporting structure and heat sink to block only a small amount of light, while maintaining a low thermal resistance between the LED and the heat sink. The heat sink is positioned not in the beam or on the periphery, but on the opposite side of the reflector relative to the LED. Because the reflector has such a compact depth, this distance is much shorter than the distance to the periphery, and the thermal resistance can be acceptably low.

DETAILED DESCRIPTION OF THE PREFERRED EMBODIMENTS

Figure 1:
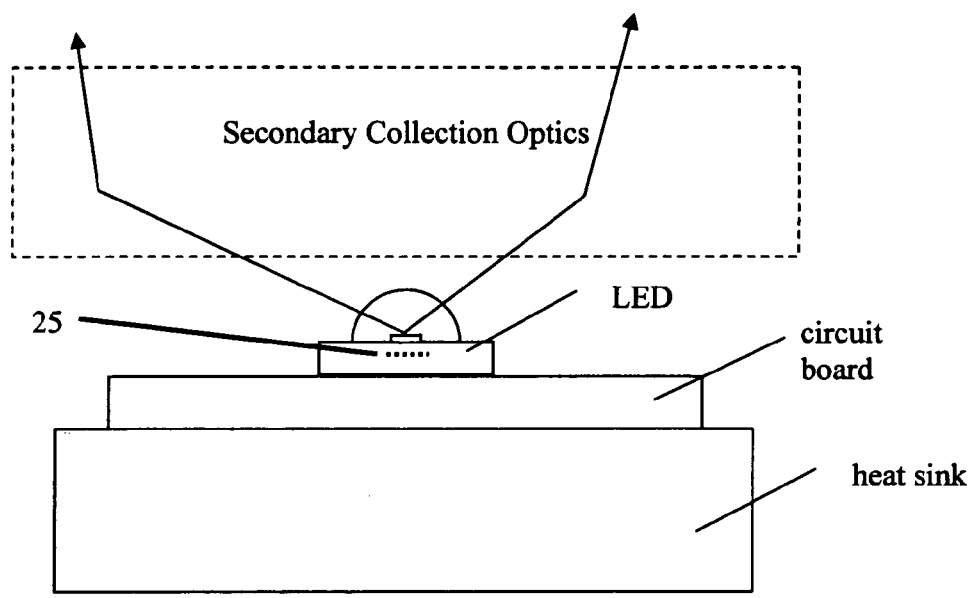
FIG. 1 shows a typical prior art LED light source.
Figure 2:
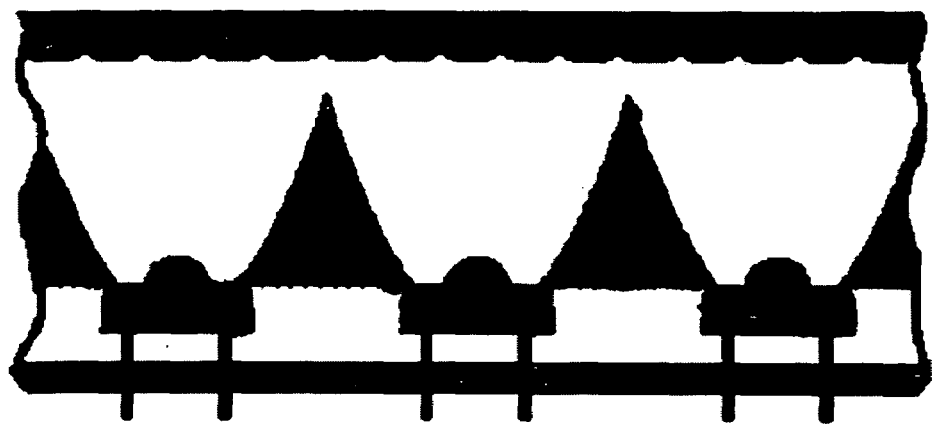
FIG. 2 shows an example of typical prior art secondary optics positioned between the LED and the direction of light emission.
Figure 2:
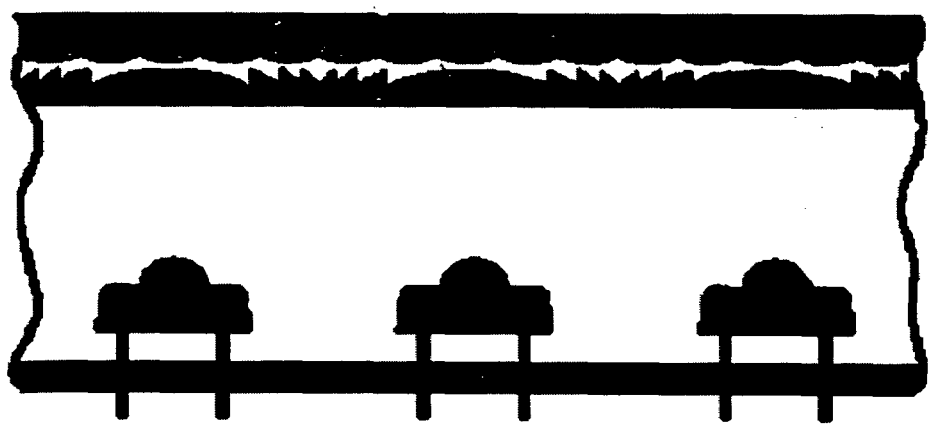
Figure 3:
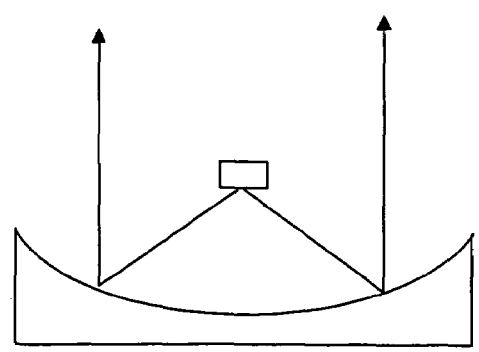
FIG. 3 shows a schematic of a prior art light source system utilizing a reflector.
Figure 4A:
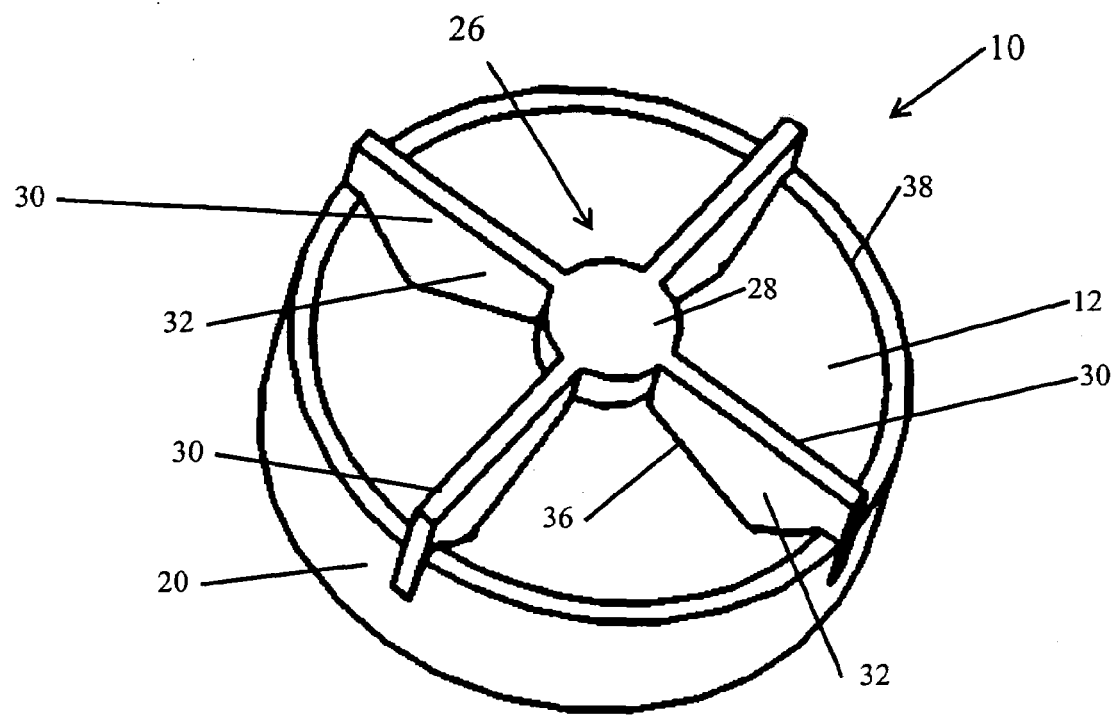
FIG. 4A, FIG. 4B, and FIG. 4C show different views of a light source constructed in accordance with the invention.
Figure 4B:
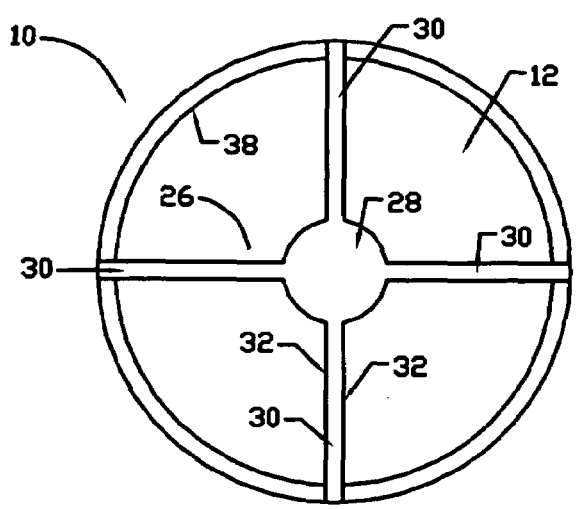
Figure 4C:
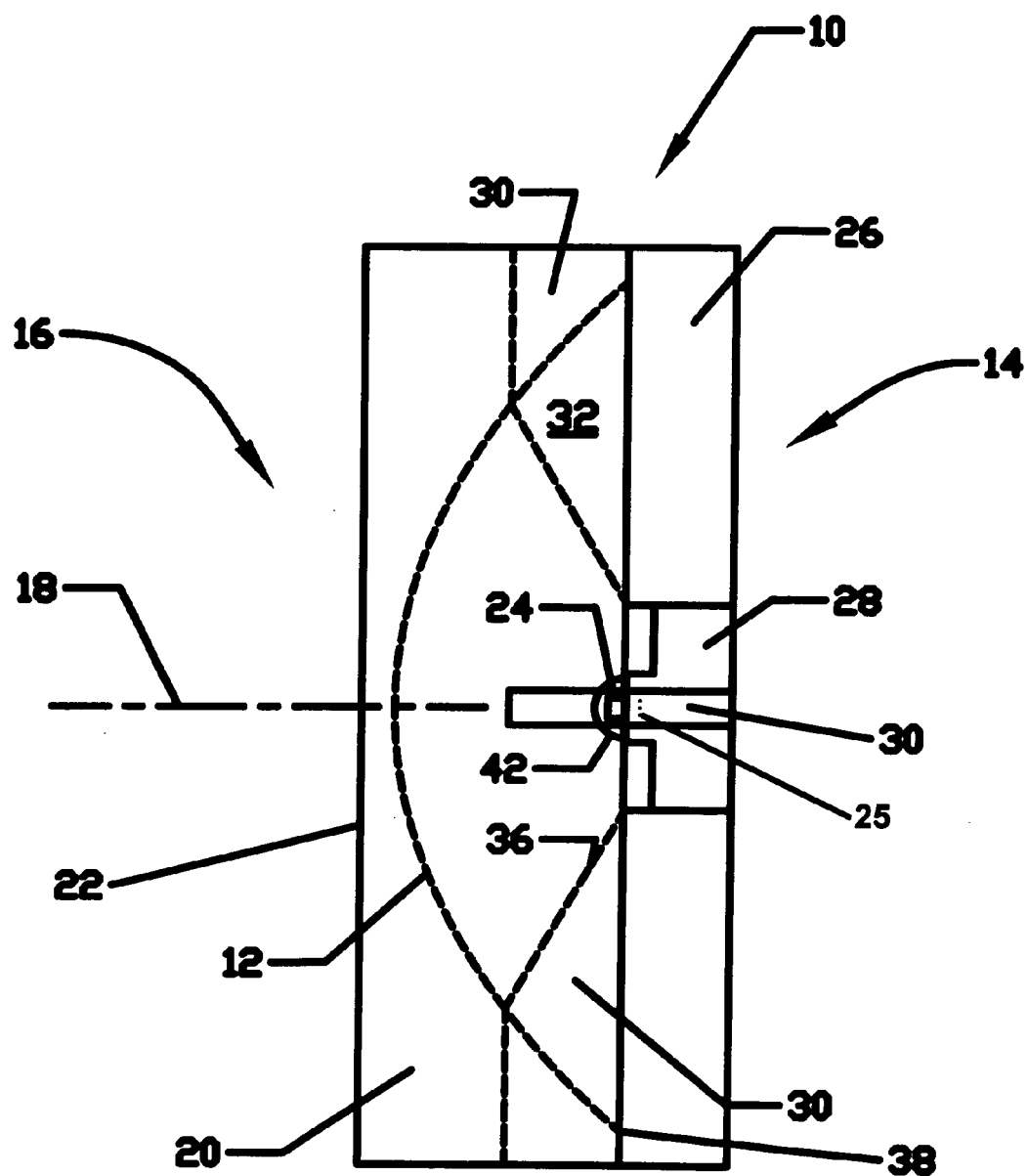

One embodiment of the invention is shown in FIGS. 4A, 4B, and 4C. The device 10 has a concave reflector 12 formed on the surface of a metallic body 20. The reflector 12 has a front side 14, a back side 16, and a central optical axis 18. The metallic body 20 acts as the heat sink, with the heat exiting the side 22 opposite the reflector 12. The LED 24 is connected to the metallic body by a "propellor" type of structure 26 with a central "hub" region 28 and one or more axial "vanes" 30. The LED 24 is not seen in FIG. 4A because it is positioned on the back side of the central hub 28, facing the reflector 12. Although the vanes 30 are in the path of light 34, their large flat sides 32 do not intercept significant amounts of light 34, because the light exiting the reflector 12 is highly collimated. These large flat sides 32 are parallel to the collimated light 34, and therefore present a very small cross-section 36 to the exiting light.

Figure 5:
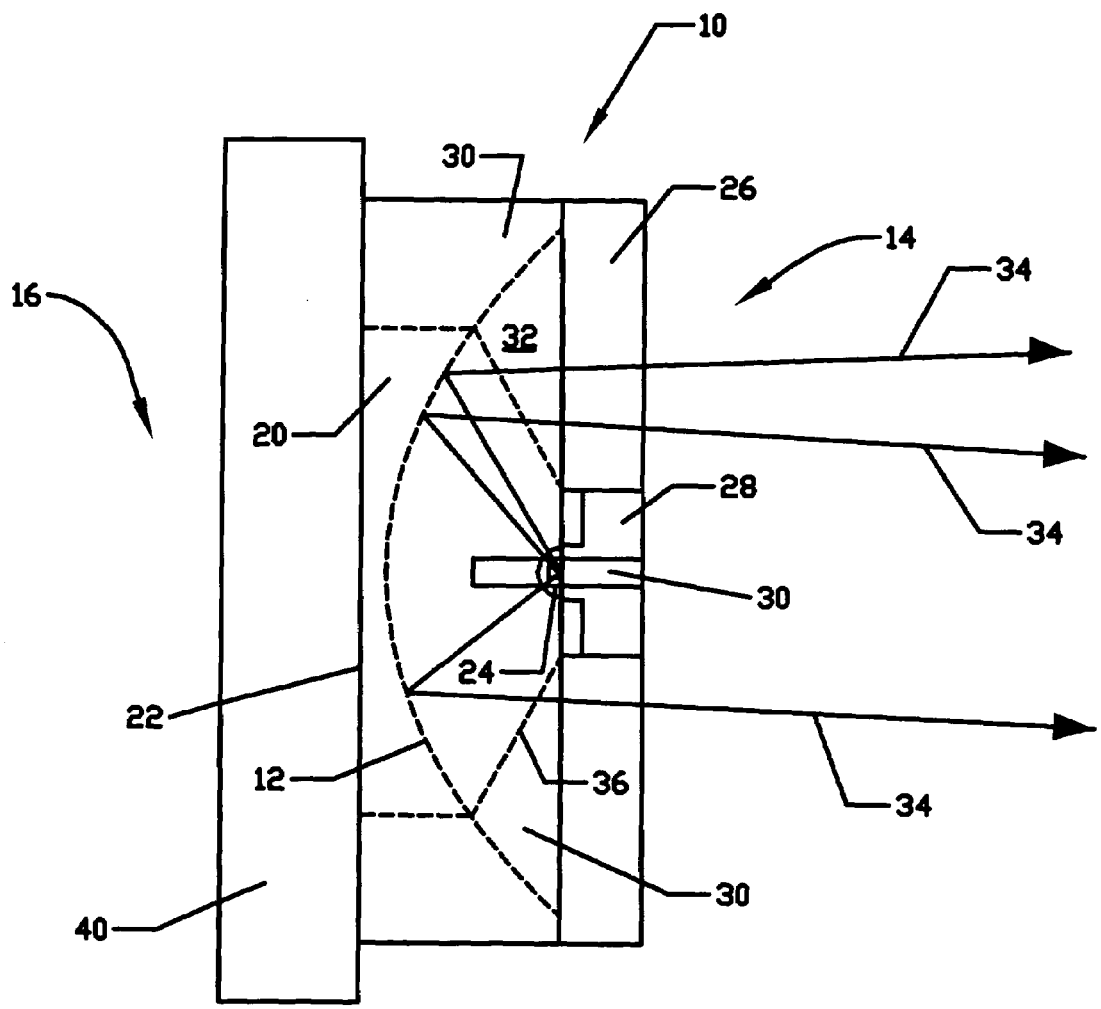
FIG. 5 shows an alternate embodiment of the invention, in which a heat sink is positioned behind the reflector.

FIG. 5 shows an alternate embodiment of the invention, along with examples of rays 34 traced through the optical system 10. An important feature of this embodiment is that the vanes 30 begin not at the central axis 18 of the reflector 12, but at a position in between the central axis 18 and the periphery 38 of the reflector 12. The angle between the edges 36 of the vanes 30 and the optical axis 18 is the "opening angle." This opening angle should be fairly large, to minimize absorption of light 34 by the edges 36 of the vanes facing the LED 24 (note that the vanes must have sufficient thickness to conduct heat away from the LED). On the other hand, the distance between the LED 24 and reflector 12 is much smaller near the center of the reflector 12. Thus, if the opening angle is too large then the heat path from the LED 24 to the reflector heat sink 40 will be too long. In general, any particular design optimizes the thickness of the vanes 30 and the opening angle to achieve a compromise between thermal conductivity and optical efficiency. Typically an opening angle between 30 and 65 degrees is optimal.

In the embodiment of FIG. 5, the reflective surface 12 and the heat sink 40 are two separate bodies, with the reflector 12 interposed between the LED 24 and the heat sink 40. The advantage of this approach is that the reflector 12 can be fabricated of non-conductive materials such as polymers, that can be more cost-effectively formed than more thermally conductive materials such as metals.

In general it is desirable for the vanes 30 to be fabricated of a highly thermally conductive material such as copper, aluminum, or graphite. Note that heat conduction through the vanes 30 is largely one-dimensional, so that it can be acceptable to use materials that have a highly anisotropic thermal conductivity, such as graphite. The vanes 30 may also be advantageously constructed as more complex thermally conducting structures, such as heat pipes.

The reflective surface 12 can take a variety of shapes. Well-known conic sections, such as paraboloids, ellipsoids, and hyperboloids can be used to focus the LED, as is well-known in the art of optical design. The surface 12 can also be a compound conic surface. In a preferred embodiment, the reflector 12 is shaped as a non-imaging reflector. One example of such a non-imaging reflector is a compound conic section where multiple sections have different edges of the light source as their focal points. When the light source is an LED 24, it is commonly immersed in an encapsulant dome 42 that forms a virtual image 25 of the LED 24. In this case; for purposes of shaping the reflector 12, the various sections of the reflector can have the edges of this virtual source as their focal points.

While preferred embodiments of the invention have been shown and described, it will be clear to those skilled in the art that various changes and modifications can be made without departing from the invention in its broader aspects.

What is claimed is:

1. A light source comprising:
   a reflector having a front side and a back side;
   at least one light-emitting element associated with said reflector and positioned on said front side;
   a volume between said reflector and said light-emitting element; said volume substantially filled by paths of light rays connecting said light-emitting element with said reflector;
   a first heat-conducting body positioned at least partially within said volume; and
   said heat-conducting body providing a pathway for heat to flow from said light-emitting element toward said back side of said reflector.

2. The device of claim 1, where said light-emitting element is a light-emitting diode.

3. The device of claim 1, where said reflector comprises a front surface of a second heat-conducting body.

4. The device of claim 3, where said second heat-conducting body is metallic.

5. The device of claim 4, where said second heat-conducting body includes at least one of copper or aluminum.

6. The device of claim 1, including a heat sink associated with said reflector and positioned on said back side, where said first heat-conducting body is thermally coupled to said heat sink.

7. The device of claim 1, wherein the distance from said light-emitting element to the periphery of said reflector is larger than the distance to at least one interior region of said reflector, and said first heat-conducting body provides a pathway for heat to flow from said light-emitting element toward said interior region.

8. The device of claim 1,
   said reflector having a central optical axis;
   said first heat-conducting body comprising a central hub positioned near said optical axis and thermally coupled to said light-emitting element; and
   at least one axial vane thermally coupled to said hub.

9. The device of claim 8, including:
   said reflector positioned for redirecting the majority of light rays from said light emitting element to exit said reflector toward said front side with said redirected rays lying in planes substantially parallel to said optical axis;
   said axial vane being positioned predominantly in one of said planes containing said optical axis; and
   said axial vane having two opposing flat sides predominantly parallel to said plane, and at least one edge perpendicular to said plane and facing said reflector, said edge being much smaller in area than either of said flat sides.

10. The device of claim 9, said edge making an angle with said optical axis between about 30 and 65 degrees.

11. The device of claim 8, said vane having a higher thermal conductivity in a first direction parallel to said plane than in a second direction perpendicular to said plane.

12. The device of claim 8, including between three and six of said axial vanes.

13. The device of claim 1, said first heat-conducting body being formed of a highly thermally conductive material.

14. The device of claim 13, said material including at least one of a metallic material or graphite.

15. A light source comprising:
   a reflector having a central optical axis;
   a light-emitting element positioned near said central optical axis;
   a volume between said reflector and said light-emitting; said volume substantially filled by paths of light rays connecting said light-emitting element with said reflector;
   a heat-conducting body comprising a central hub and at least one axial vane positioned at least partially within said volume; and
   said axial vane positioned predominantly in a plane containing said central optical axis, and said axial vane having a higher thermal conductivity in at least one direction within said plane than in the direction perpendicular to said plane.

16. The device of claim 15, where said axial vane includes a material having anisotropic thermal conductivity.

17. The device of claim 15, where said axial vane includes a heat pipe.

18. A light source comprising:
   a reflector having a front side, a back side, and a central optical axis;
   at least one light-emitting element associated with said reflector and positioned on said front side;
   a first heat-conducting body comprising a central hub positioned near said optical axis and thermally coupled to said light-emitting element;
   at least one axial vane thermally coupled to said hub;
   said reflector redirecting the majority of light rays from said light-emitting element to exit said reflector toward said front side with said redirected rays lying in planes substantially parallel to said optical axis;

said axial vane being positioned predominantly in one of said planes containing said optical axis; and said axial vane having two opposing flat sides predominantly parallel to said plane, and at least one edge perpendicular to said plane and facing said reflector, said edge being much smaller than either of said flat sides.

19. The device of claim 18, where said reflector is a non-imaging reflector.

20. The device of claim 19, where said non-imaging reflector includes at least one conic section having at least one focal point at an edge of said light-emitting surface.

21. The device of claim 20, including a light-emitting diode immersed in an encapsulant dome forming a virtual image of said light-emitting diode, and said light-emitting surface comprising said virtual image.

* * * * *